(12) United States Patent
Dickey et al.

(10) Patent No.: US 6,320,122 B1
(45) Date of Patent: Nov. 20, 2001

(54) ELECTROMAGNETIC INTERFERENCE GASKET

(75) Inventors: David Dickey, Auburn; James J. DeBlanc, Roseville; Andrew M. Cherniski, Rescue, all of CA (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/416,490

(22) Filed: Oct. 12, 1999

(51) Int. Cl.[7] ................................................... H05K 09/00
(52) U.S. Cl. ............................ 174/35 GC; 174/35 MS; 428/36.1
(58) Field of Search ...................... 174/35 GC, 35 MS, 174/35 R; 428/209, 36.1, 36.2, 36.3, 36.365; 139/425 R, 426 R

(56) References Cited

U.S. PATENT DOCUMENTS 5,569,877 * 10/1996 Yumi ............................... 174/35 GC
5,712,449 * 1/1998 Miska et al. ..................... 174/35 GC
5,959,244   9/1999 Mayer .............................. 17/35 GC

OTHER PUBLICATIONS http://www.amp–emi.com/panels.html, An Improved Solution to I/O Connector Shielding, APM –EMI Shielding I/O Panels, pp. 1—2, printed off the URL on Oct. 8, 1999.
http://www.chomerics.com, Low–Cost Conductive Elastomer EMI Gaskets, CHOMERICS, pp. 1—2. (no date).

* cited by examiner

Primary Examiner—Jessica Han

(57) ABSTRACT

An EMI device that provides a low impedance mechanism for conducting noise currents in all orientations back to the source of the noise currents in order to more effectively reduce EMI emissions is herein described. The EMI device is constructed from an elastomer core that is wrapped with a metallized electrically conductive material. The gasket is die cut and as such includes one or more open edges that are non-conductive. The non-conductive edges are stitched with a conductive material thereby enabling multiple conduction paths between any surface or edge of the gasket with a electrically conductive enclosure. In this manner, the gasket is able to provide a return path back to the source of the noise currents for all orientations of the noise currents and hence, more effectively reduce EMI emissions.

9 Claims, 8 Drawing Sheets

ELECTROMAGNETIC INTERFERENCE GASKET

FIELD OF THE INVENTION

The present invention relates generally to electronic systems. More particularly, the invention relates to an electronic magnetic interference (EMI) surface conducting gasket.

Background of the Invention

The operation of electronic circuitry is often accompanied by the generation of noise currents that when radiated produce EMI emissions. The noise currents and the EMI emissions can cause significant electronic interference with other surrounding electronic circuitry. As such, the sources of these noise currents need to be effectively shielded in order to prevent this disturbance.

Typically, electronic circuitry is placed into an enclosure or housing. In one type of enclosure, there are slots on one wall of the enclosure that are used to house one or more I/O connectors. The I/O connectors are used to connect the electronic circuitry housed inside the enclosure with external peripheral devices. The I/O connector body or housing is a source of noise currents and potential EMI emissions and as such, requires effective shielding.

One EMI shielding technique commonly used for this problem is gaskets made of metal stampings. A stamped metal EMI gasket is a thin metal sheet cut to fit the size and shape of the I/O connectors and includes a number of spring fingers that make contact with a metal enclosure wall. The noise currents generated from the I/O connector housing flow through the fingers and into the enclosure wall without transcending beyond the enclosure.

There are several disadvantages with metal stamp gaskets. First, in order to provide adequate mechanical compliance, the spring fingers are usually longer than they are wide. As such, the spring fingers are electrically inductive and poor conductors for high EMI frequencies. Second, the metal-to-metal contact between the gasket and the enclosure wall degrades any coating or plating on these surfaces thereby corroding the coating and limiting the shielding effectiveness of the gasket. In addition, the metal stamp gaskets are costly to fabricate and require special tooling to manufacture them.

Another EMI shielding technique involves the use of surface conducting gaskets. A surface conducting gasket includes a metallized fabric wrapped over an elastomer core. The conductive surfaces provide many metal contact points. Surface conducting gaskets are beneficial over metal stamp gaskets since they provide constant low impedance grounding and do not suffer from the problems associated with metal-to-metal contact. In addition, the surface conducting gaskets can be die cut using simpler and less costly tools which make them a more economical alternative to metal stamp gaskets.

FIG. 1 illustrates an exemplary surface conducting gasket 100 having a top conductive surface 102, a bottom conductive surface 103, and an aperture 104 that is cut to the dimensions of a particular I/O connector. Noise currents generated from the I/O connector housing flow through one of the metallized conductive surfaces 102, 103 through the metal enclosure wall and return back to the I/O connector housing. However, there are gaps in the conductive surfaces 102, 103 due to the non-conductive or open edges 106*a*–106*d*, 108*a*–108*d* of the gasket 100 and of the aperture 104. As such, these open edges 106, 108 provide discontinuities in the conduction paths that are provided by the conductive surfaces 102, 103 and allow EMI emissions to radiate from the enclosure.

FIG. 2 illustrates another exemplary surface conducting gasket 110 having a top conductive surface 112, a bottom conductive surface 114, and a side conductive surface 116. The metallized fabric is wrapped over one edge of the gasket 110 thereby providing an additional conductive surface. These conducting surfaces 112, 114, 116 provide additional return paths for the noise currents and are more effective at shielding EMI emissions when the noise currents align with the conduction paths provided by the conductive gasket surfaces 112, 114, 116.

However, it is difficult to route all orientations of the noise currents to flow in the direction of a particular conduction path. As such, the surface conducting gaskets shown in FIGS. 1 and 2, cannot shield all potential noise current and EMI emissions due to the open edges that limit the number of available conduction paths to the enclosure wall. Accordingly, there is a need for an EMI shielding device that can overcome this shortcoming.

SUMMARY OF THE INVENTION

The present invention pertains to an EMI device that provides a low impedance mechanism for conducting noise currents in all orientations back to the source of the noise currents in order to more effectively reduce EMI emissions.

In an embodiment of the present invention, the EMI device is applied to an enclosure that houses electronic circuitry. The electronic circuitry is connected through I/O connectors to external peripheral devices. The enclosure includes slots that enable the passage of the I/O connectors to connect with the electronic circuitry housed in the enclosure. The I/O connectors are a source of noise currents and EMI emissions. As such, the EMI gasket of the present invention is used to more effectively shield the noise currents and the EMI emissions.

The EMI gasket is constructed from an elastomer core that is wrapped with a metallized electrically conductive material. The EMI gasket includes one or more apertures that are used to house one or more I/O connectors. The gasket is die cut and as such includes one or more open edges that are non-conductive. The non-conductive edges are stitched with a conductive material that provides multiple conduction paths between any surface or edge of the gasket and with the enclosure wall. In this manner, the gasket is able to provide a return path back to the source of the noise currents for all orientations of the noise currents.

The EMI gasket of the present invention is beneficial for several reasons. First, it is more effective for shielding noise currents and EMI emissions for all orientations of the noise currents. In addition, it is easy to manufacture and less costly since it does not require specialized tooling.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 3:
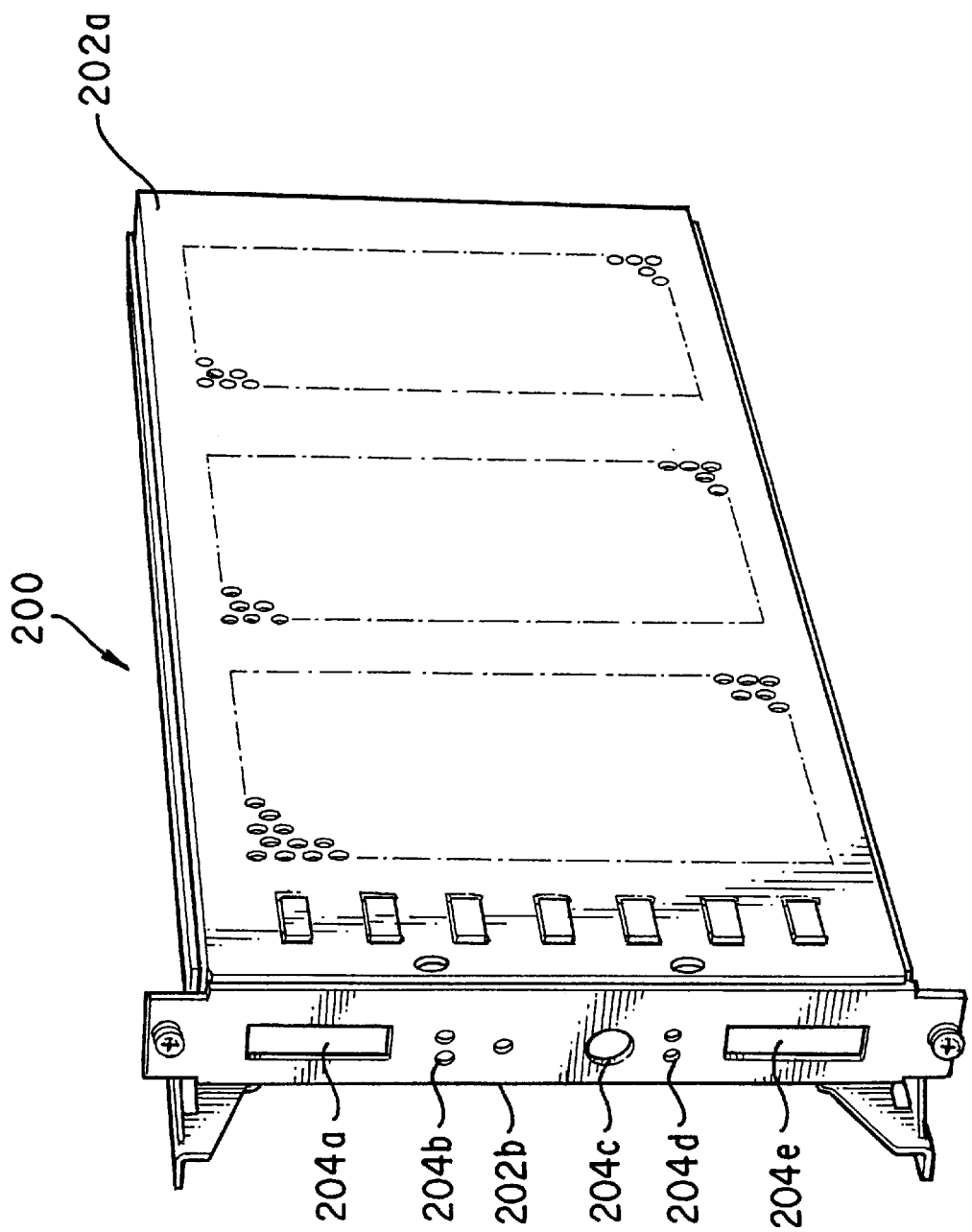
FIG. 3 illustrates an exemplary computer enclosure used in an embodiment of the present invention.

FIG. 3 illustrates an exemplary enclosure 200 housing electronic circuitry (not shown). The enclosure 200 can be placed into another enclosure that is part of a computer system, electrical system, or the like. The enclosure 200 can be fabricated of metal and has a number of walls 202a–202b. One such wall 202b has a number of slots 204a–204e that enable I/O connectors to connect to the electronic circuitry housed inside the enclosure 200 with external peripheral devices.

Figure 4:
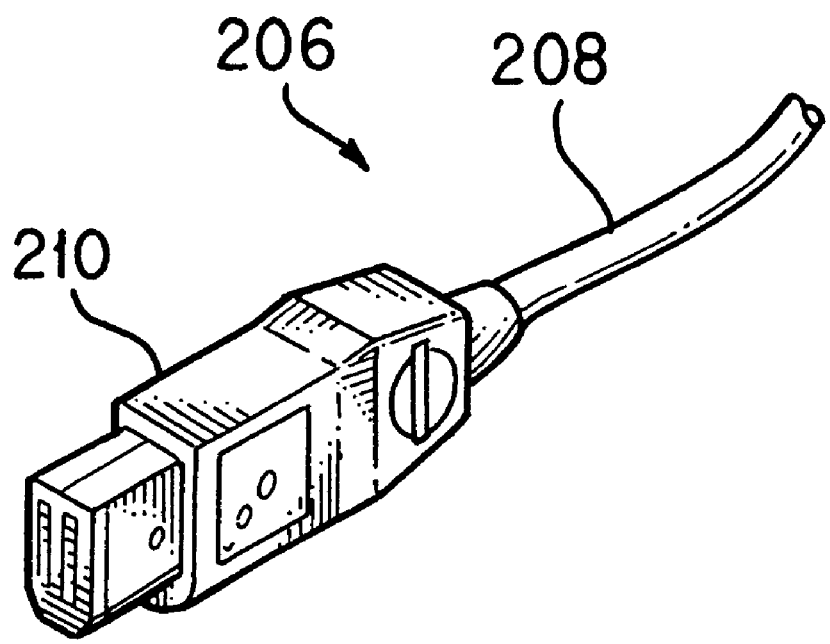
FIG. 4 illustrates an exemplary I/O connector used in an embodiment of the present invention.

FIG. 4 illustrates an exemplary I/O connector 206 including a cable 208 and an I/O connector housing or body 210. The I/O connector housing 210 is typically mated with electronic equipment housed within the enclosure 200. It should be noted that the technology of the present invention is not constrained to any particular type of I/O connector and that the I/O connector shown in FIG. 4 is provided for illustration purposes only.

Figure 5:
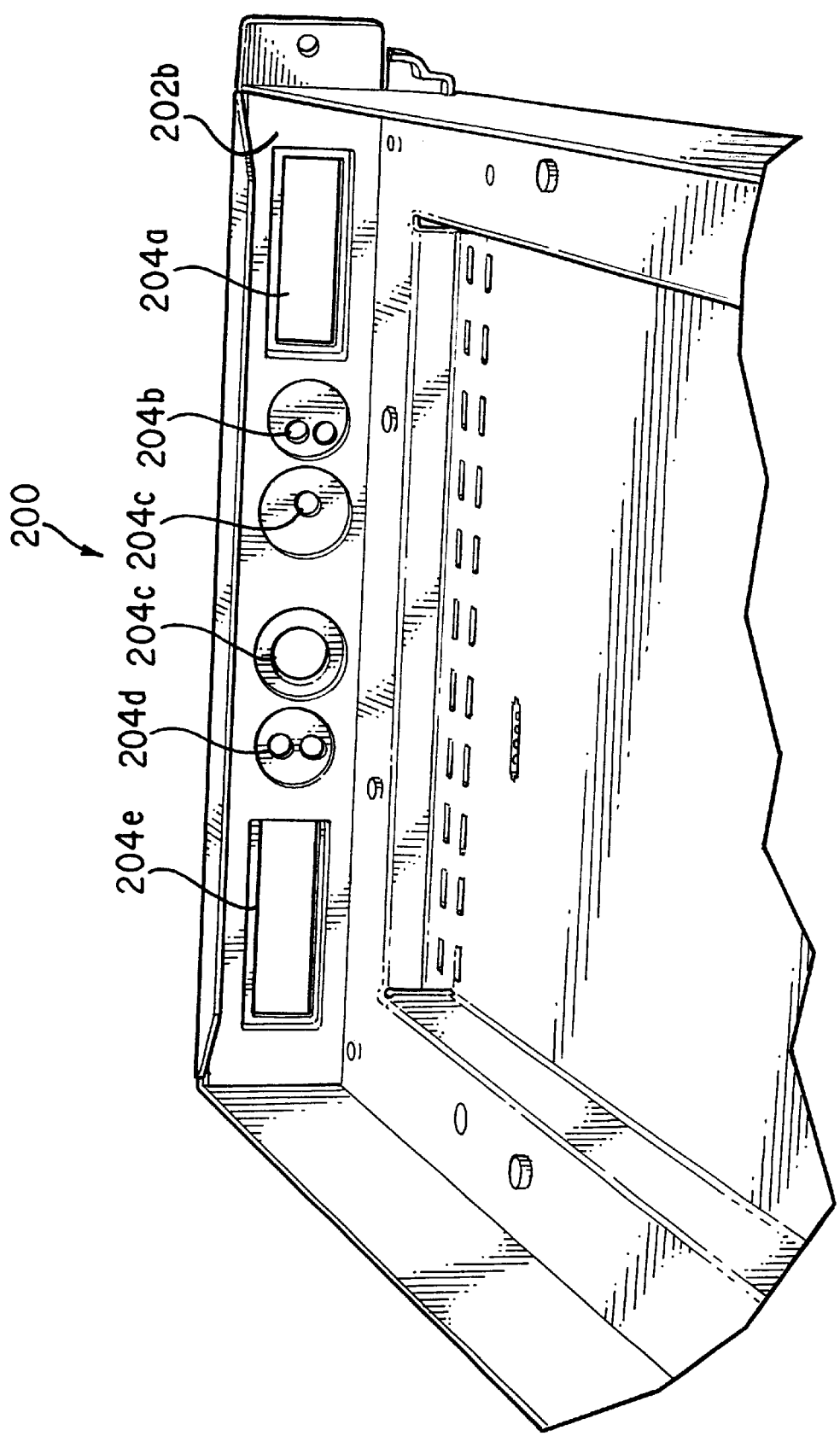
FIG. 5 is an interior view of the exemplary computer enclosure shown in FIG. 3.

FIG. 5 illustrates the interior side of the enclosure wall 202b that includes the I/O connector slots 204. As is shown in FIGS. 3 and 5, the slots 204 are of different shapes and sizes and are usually based on the dimensions of a particular I/O connector.

Figure 6:
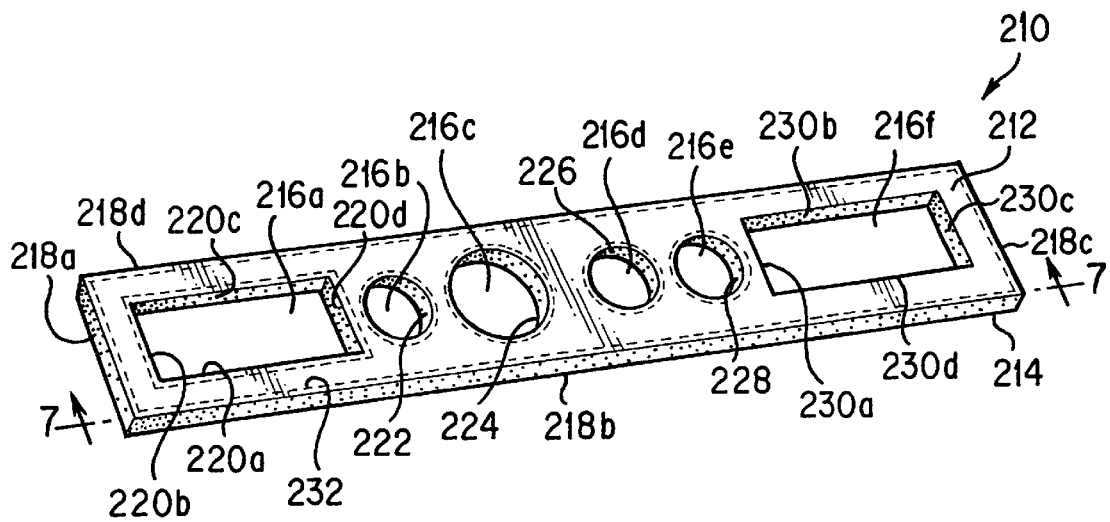
FIG. 6 is an isometric view of an EMI gasket in accordance in an embodiment of the present invention.

The I/O connector housing 210 and the I/O connector slots 204 are a source of noise currents and EMI emissions due to the gaps between the enclosure wall and the I/O connector housing. These small gaps can be radiating points for EMI emissions, especially where high frequency electronic circuitry is used. In addition, the I/O connectors 206 can act as wavelength antennae. In order to prevent an I/O connector housing 210 from emitting EMI emissions, there needs to be a low-impedance mechanism for conducting the noise currents in all orientations from the I/O enclosure housing through the shortest return path back to the source of the noise currents. This mechanism can then more effectively reduce any potential EMI emissions and especially for high frequency signals. As such, the EMI gasket 210 shown in FIG. 6 is placed on the interior side of the enclosure wall 202b in order to provide a low-impedance bond with the enclosure 200 thereby providing a return path back to the I/O connector 206 for all orientations of noise currents. Accordingly, the EMI gasket 210 is more effective at shielding most of the EMI emissions.

Referring to FIG. 6, the EMI gasket 210 is a surface conducting gasket that is die cut in accordance with the I/O connector configuration. Preferably, an elastomer surface conducting gasket can be used, such as, but not limited to, FoamTite® EMI gasket manufactured by the Advanced Performance Materials, CHO-SEAL® and CHO-SIL® elastomer EMI gaskets manufactured by Chomerics, and the like. The elastomer surface conducting gasket is fabricated with a non-conductive foamed elastomer, such as neoprene®, urea foam®, poron®, or the like, with one or more highly conductive surfaces that can be fabricated from a metal foil, metalized cloth, or woven metal filament.

Figure 7:
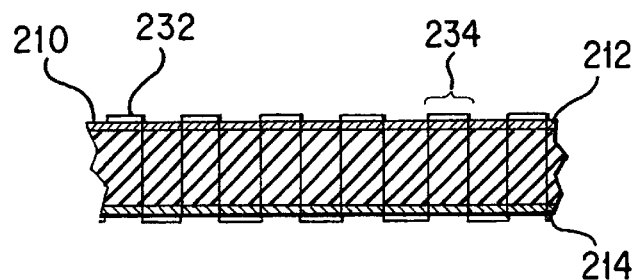
FIG. 7 is a cross-sectional view of the EMI gasket shown in FIG. 6 taken along plane 7—7.

As shown in FIGS. 6 and 7, the EMI gasket 210 has a top 212 and bottom 214 conductive surface and a number of apertures 216a–216f that are configured to allow I/O connectors to connect to electronic circuitry housed in the enclosure. The edges 218a–218d of the gasket 210 and the edges 220, 222, 224, 226, 228, 230 of each aperture 216 are conductive since these edges 220, 222, 224, 226, 228, 230 are stitched with a conductive material 232 such as a filament or thread that can be a Flectron® fiber, metallized ribbon, thin wire, or the like. The conductive material 232 can be stitched into the surface conducting gasket using an automated sewing machine such as a serger, computer numeric controlled sewing machine, or the like.

The purpose of the conductive material 232 is to eliminate any gaps in the conduction paths that the open edges provide and to ensure that there are multiple conductive paths between the top and bottom conductive surfaces to the enclosure wall. In this manner, the EMI gasket 210 can conduct noise currents in all orientations from the I/O connector housing 210 through the enclosure.

The shielding effectiveness of the EMI gasket 210 is based in part on the width of each stitch 234. Each stitch 234 acts as a waveguide that transmits electromagnetic energy above a certain frequency, known as the cutoff frequency. Below the cutoff frequency, a RF and/or electromagnetic field passing through the waveguide decreases rapidly with distance and is attenuated. The amount of attenuation is based on the cross-sectional dimensions and length of the waveguide.

An important factor for obtaining a desired shielding effectiveness is the dimension of the stitch 234. The stitch dimension is determinative of the spectrum of frequency signals that can be attenuated. A low impedance bond is important for attenuating high frequency signals, especially for those signals exceeding 1 Ghz. In order to maintain a low impedance bond, there needs to be a large number of stitches or perforations per inch. Preferably, 10 stitches or perforations per inch is desirable to attenuate high frequency signals in excess of 1 GHz which is discussed in more detail below.

Figure 8:
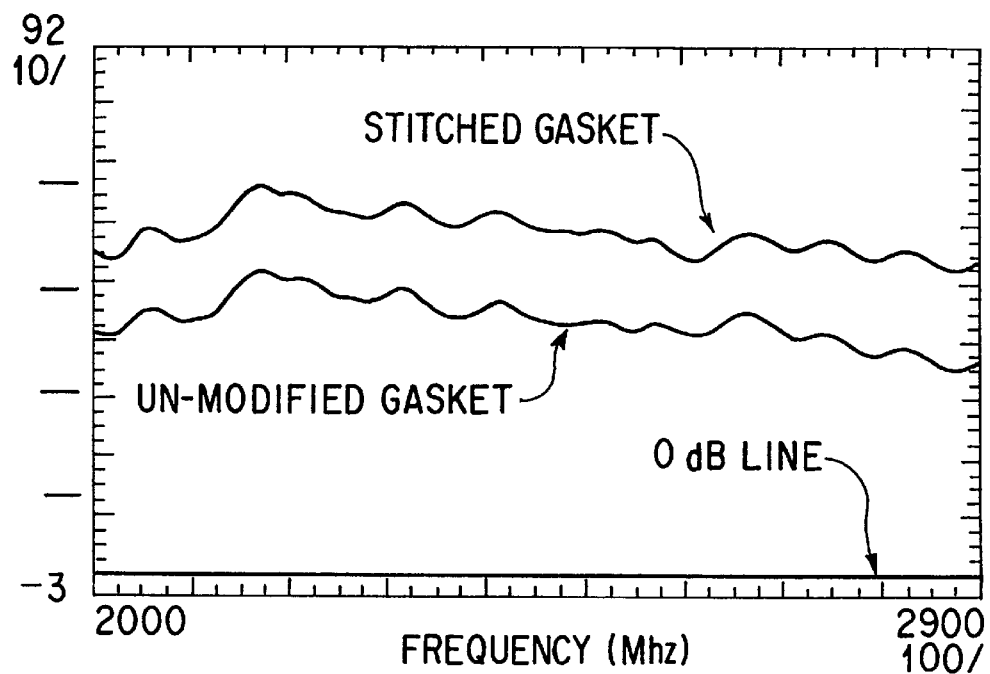
FIG. 8 is a first graphical representation of the attenuation of electromagnetic interference through the use of an embodiment of the present invention.
Figure 9:
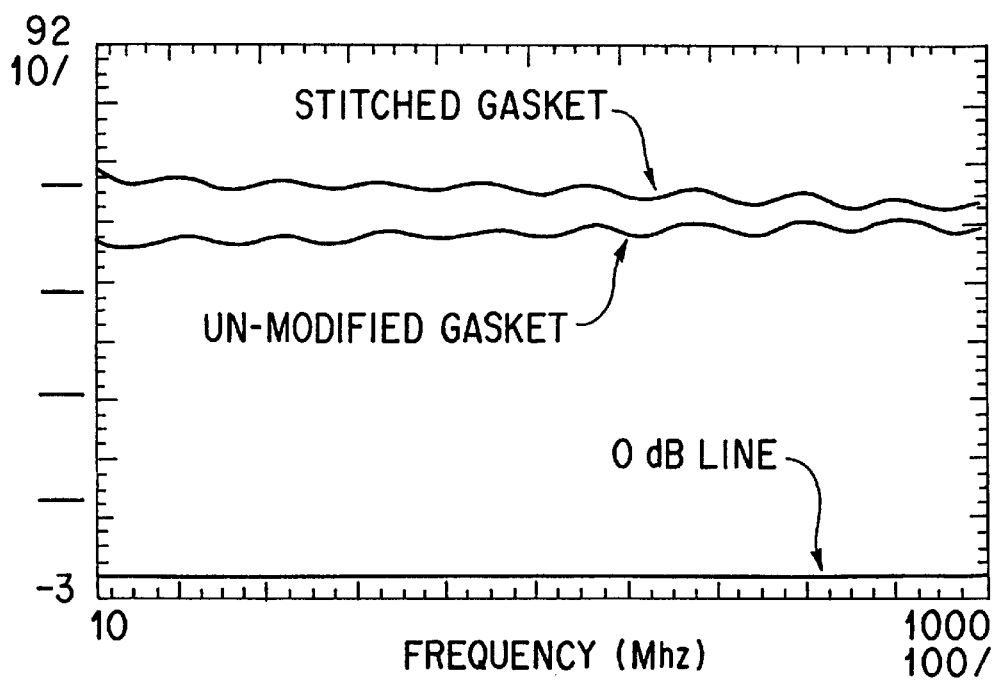
FIG. 9 is a second graphical representation of the attenuation of electromagnetic interference through the use of an embodiment of the present invention.

FIGS. 8 and 9 are graphical representations showing the attenuation of noise currents against a spectrum of operating frequencies. The data shown in FIGS. 8 and 9 was generated for an EMI gasket having a single aperture fitted to suit a DB 9 type connector which is commonly used for computer serial ports. The outer edges of the EMI gasket were stitched with a conductive material with ten (10) stitches or perforations per inch.

The graphical representation of FIG. 8 represents the attenuation for a low frequency spectrum ranging from 10 Mhz to 1 Ghz. As shown there, the stitched gasket results in an improved shielding effectiveness ranging from 3 dB to 11 dB compared with an unstitched or unmodified gasket. FIG. 9 represents the attenuation for a high frequency spectrum ranging from 2 GHz to 2.9 Ghz. The stitched gasket improves the shielding effectiveness by at least 12 dB of additional attenuation and as much as 17 dB at certain frequencies.

There are also numerous variations that can be applied to the EMI gasket 210 shown in FIG. 6. For instance, in another preferred embodiment of the invention, instead of stitching all the open edges, select edges of the gasket and apertures are stitched in order to provide the desired shielding effectiveness. By stitching only those edges that contribute most to EMI radiation, then the total cost of the gasket can be reduced. An EMI gasket may also be designed to span several sub-components of a circuit board and not all of the apertures of those sub-components may need EMI suppression. Additionally, apertures that are too small to pass EMI energy at the frequencies of concern would not need to be stitched as well.

Figure 1:
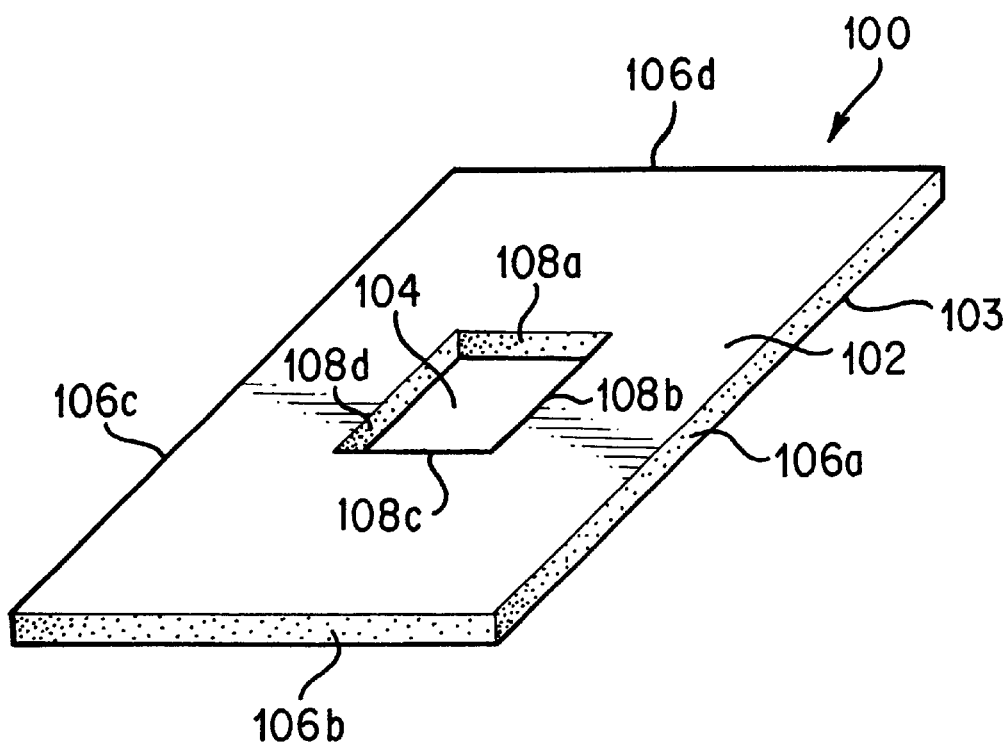
FIG. 1 is a view of a first exemplary surface conducting gasket.
Figure 2:
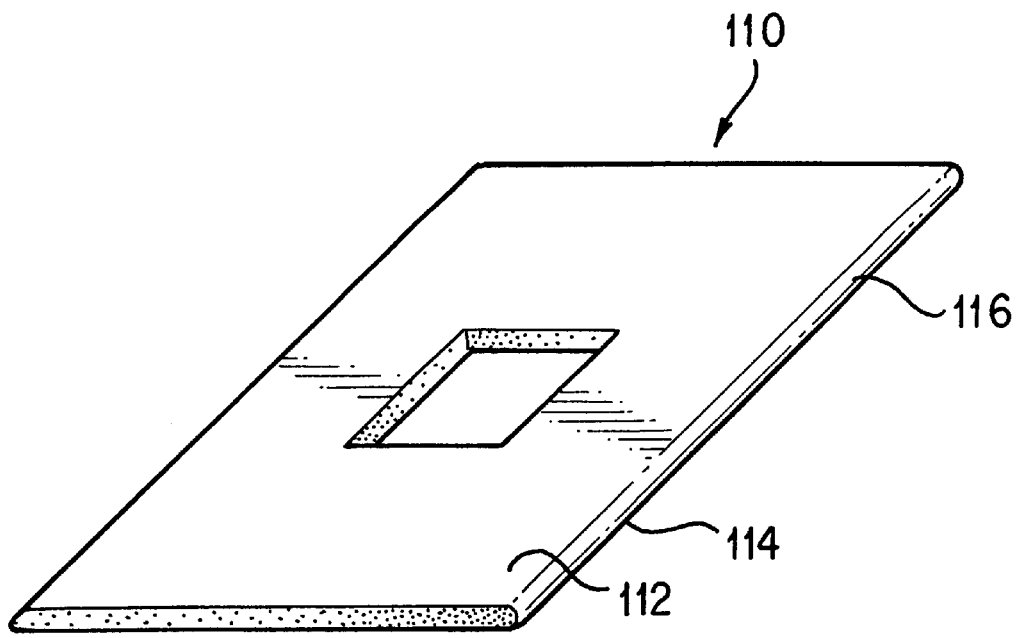
FIG. 2 is a view of a second exemplary surface conducting gasket.

In yet another alternate embodiment of the present invention, the outer edges of the gasket can be wrapped with a metallic conductive surface similar to the conductive edge 114 of the gasket 110 shown in FIG. 2. The stitches would then be applied to either all the open edges or to select open edges.

Figure 10:
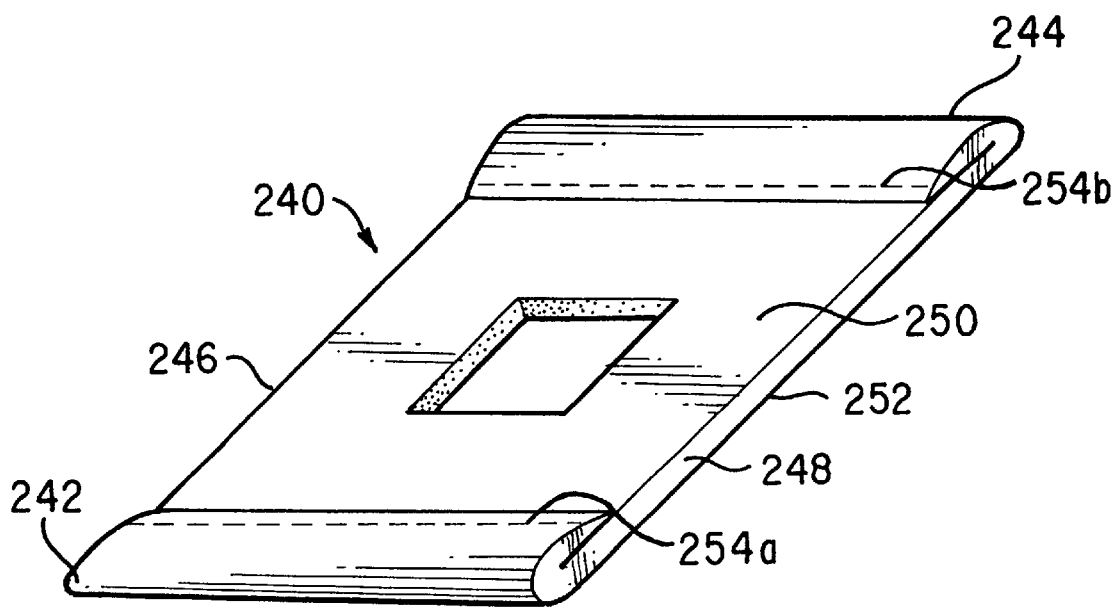
FIG. 10 is an isometric view of an EMI gasket in accordance with an alternate embodiment of the present invention.
Figure 11:
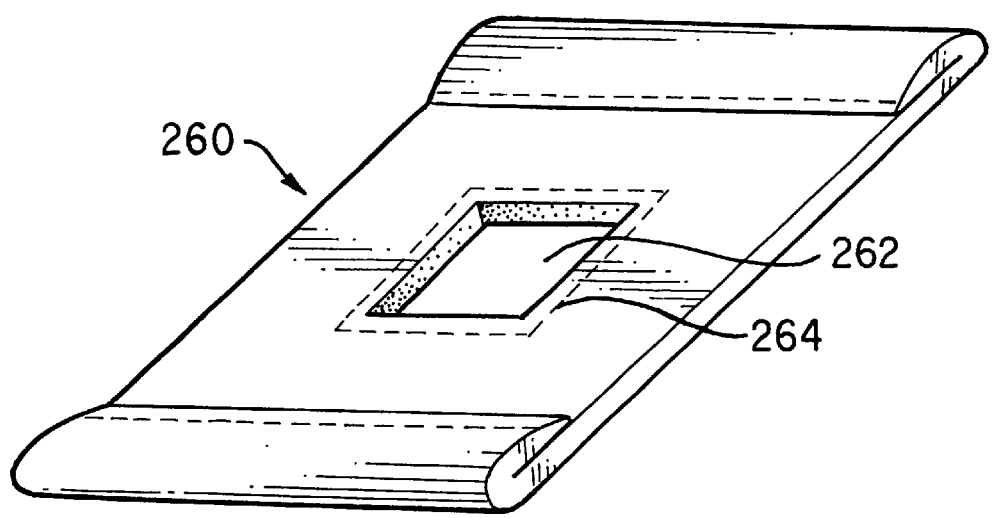
FIG. 11 is an isometric view of an EMI gasket in accordance with another alternate embodiment of the present invention.

FIGS. 10 and 11 illustrate additional preferred embodiments of the present invention. FIG. 10 illustrates an EMI gasket 240, similar to the EMI gasket 210 described above, except that the gasket 240 has two folded edges 242, 244 and two non-folded edges 246, 248. The folded edges 242, 244 are formed by folding over the surface conducting material and inner core foam over onto one of the conductive surfaces 250, 252. The folded edges 242, 244 then form a conductive seal with the top conductive surface 250 and the bottom conductive surface 252. As such, the need to stitch the folded edges with a conductive material is not as imperative as is the case of an EMI gasket having open edges. In this embodiment, the folded edges 242, 244 can be stitched 254a, 254b with either a non-conductive or conductive material. In addition, the non-folded edges 246, 248 can be either open edges or conductive edges that are wrapped with a conductive material.

An EMI gasket constructed in this manner is beneficial since it provides a tighter seal and a more effective return path for stray noise currents. In addition, the use of the non-conductive thread would make the gasket easier to manufacture and more economical than a gasket made with a conductive filament.

FIG. 11 illustrates an EMI gasket 260 constructed in a similar manner as the one shown in FIG. 10 except that the perimeter of the aperture 262 is stitched with a conductive material 264. As noted above, there are situations where the desired shielding effectiveness can be obtained by providing a conductive path along select edges of the gasket instead of every open edge.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

It should be noted that although the present invention has been described with respect to an electronic enclosure, the present invention can be easily adapted for use in a shielded room, shielding cabinets, or in any other type of device requiring EMI and/or RF shielding. In addition, the present invention is not constrained for use with I/O connectors and can be used with any application that requires EMI shielding.

Figure 12A:
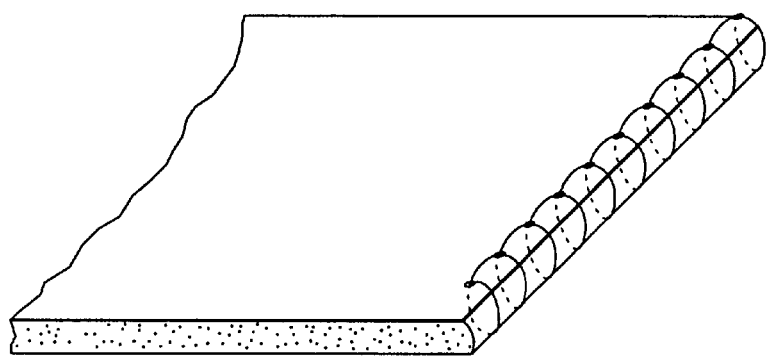
FIGS. 12A–12C are isometric views of additional stitches for use in an embodiment of the present invention.
Figure 12B:
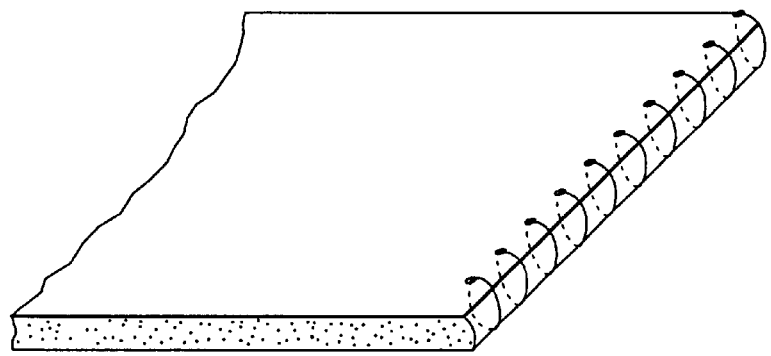
Figure 12C:
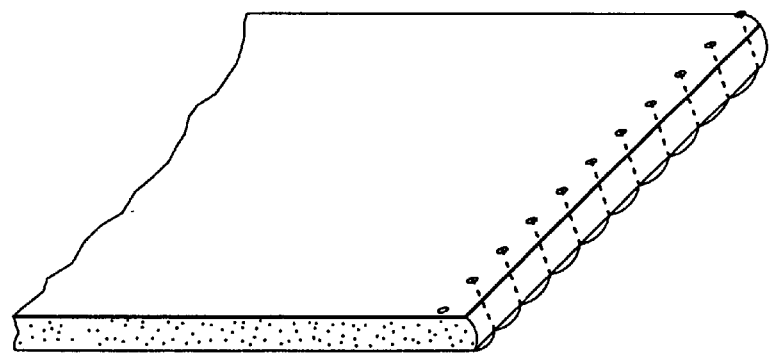

In addition, the present invention is not constrained to any particular type of stitching. There are numerous types of stitches that are well-known in the art and any one or combination of these can be used. For illustration purposes, FIGS. 12A–12C illustrate examples of other types of stitch patterns that can be used.

What is claimed is:

1. A gasket for reducing electromagnetic interference, comprising:

a first electrically conductive material in electrical connection with a first electrically conducting housing;

a second electrically conductive material in electrical connection with a second electrically conducting house, the second electrically conductive surface wrapped over onto the first electrically conductive material;

a non-electrically conductive material positioned between the first and second electrically conductive materials; and a third electrically conductive material coupled to the first electrically conductive material, the second electrically conductive material, and the non-electrically conductive material, the third electrically conductive material making electrical contact with the first and second electrically conductive materials.

2. The apparatus of claim 1, wherein the third electrically conductive material is sewn between the first electrically conductive material, the second electrically conductive material, and the non-electrically conductive material.

3. An apparatus for shielding electromagnetic interference, comprising:

a non-electrically conductive material including a top surface, a bottom surface, and a plurality of edges;

the top surface having a first electrically conductive material disposed thereon;

the bottom surface having a second electrically conductive material disposed thereon;

a plurality of first electrically conductive stitches positioned on at least one of the plurality of edges, each stitch making electrical contact between the top and bottom surfaces.

4. The apparatus of claim 3, comprising:

a first edge including a plurality of second electrically conductive stitches positioned on a perimeter of the first edge, each stitch making an electrical contact between the top and bottom surfaces.

5. The apparatus of claim 4, comprising:

a second edge including an electrically conductive surface disposed thereon.

6. The apparatus of claim 5, wherein the electrically conductive surface of the second edge is formed from the electrically conductive material of the top surface.

7. The apparatus of claim 6, wherein the electrically conductive material of the top surface is wrapped over onto the second edge.

8. The apparatus of claim 7, comprising:

a plurality of third electrically conductive stitches positioned on a perimeter of the first edge, each stitch making an electrical contact between the top and bottom surfaces.

9. A gasket for reducing electromagnetic interference, comprising:

a first electrically conductive material in electrical connection with a first electrically conducting housing;

a second electrically conductive material in electrical connection with a second electrically conducting housing, the second electrically conductive material wrapped over onto the first electrically conductive material and in electrical contact with the second electrically conductive surface a non-electrically conductive material positioned between the first and second electrically conductive materials.

* * * * *

UNITED STATES PATENT AND TRADEMARK OFFICE
CERTIFICATE OF CORRECTION

PATENT NO. : 6,320,122 B1
DATED : November 20, 2001
INVENTOR(S) : Dickey et al.

It is certified that error appears in the above-identified patent and that said Letters Patent is hereby corrected as shown below:

Column 8,
Line 11, delete "surface" and insert therefor -- surface; and --

Signed and Sealed this

Twenty-sixth Day of August, 2003

JAMES E. ROGAN
Director of the United States Patent and Trademark Office